United States Patent
Guo et al.

(10) Patent No.: US 7,582,942 B2
(45) Date of Patent: Sep. 1, 2009

(54) PLANAR FLUX CONCENTRATOR FOR MRAM DEVICES

(75) Inventors: Yimin Guo, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/290,410

(22) Filed: Oct. 30, 2008

(65) Prior Publication Data
US 2009/0057794 A1 Mar. 5, 2009

Related U.S. Application Data

(62) Division of application No. 11/476,495, filed on Jun. 28, 2006, now Pat. No. 7,456,029.

(51) Int. Cl.
*H01L 21/00* (2006.01)
(52) U.S. Cl. ............... 257/421; 257/422; 257/316
(58) Field of Classification Search ......... 257/421–422, 257/316
See application file for complete search history.

(56) References Cited

U.S. PATENT DOCUMENTS

| | | | | |
|---|---|---|---|---|
| 6,548,849 B1 * | 4/2003 | Pan et al. | | 257/296 |
| 6,559,511 B1 | 5/2003 | Rizzo | | |
| 6,709,942 B2 * | 3/2004 | Pan et al. | | 438/381 |
| 6,803,615 B1 * | 10/2004 | Sin et al. | | 257/295 |
| 6,885,074 B2 | 4/2005 | Durlam et al. | | |
| 6,943,038 B2 | 9/2005 | Meixner et al. | | |
| 6,979,586 B2 * | 12/2005 | Guo et al. | | 438/48 |
| 6,982,445 B2 * | 1/2006 | Tsang | | 257/295 |
| 7,132,707 B2 * | 11/2006 | Min et al. | | 257/295 |
| 7,211,874 B2 * | 5/2007 | Guo et al. | | 257/422 |
| 7,335,961 B2 * | 2/2008 | Guo et al. | | 257/422 |
| 7,443,707 B2 * | 10/2008 | Guo et al. | | 365/130 |
| 7,443,718 B2 * | 10/2008 | Ito et al. | | 365/158 |
| 7,456,029 B2 * | 11/2008 | Guo et al. | | 438/3 |
| 2004/0099908 A1 | 5/2004 | Durlam et al. | | |
| 2004/0222450 A1 * | 11/2004 | Tsang | | 257/295 |
| 2004/0233760 A1 * | 11/2004 | Guo et al. | | 365/222 |
| 2005/0026308 A1 | 2/2005 | Ingvarsson et al. | | |
| 2005/0158992 A1 | 7/2005 | Durlam et al. | | |
| 2005/0164413 A1 | 7/2005 | Meixner et al. | | |
| 2005/0208681 A1 | 9/2005 | Meixner et al. | | |
| 2005/0219895 A1 * | 10/2005 | Guo et al. | | 365/173 |
| 2005/0274997 A1 | 12/2005 | Gaidis et al. | | |
| 2005/0280960 A1 * | 12/2005 | Guo et al. | | 360/327.22 |
| 2006/0028862 A1 * | 2/2006 | Min et al. | | 365/158 |
| 2006/0083053 A1 | 4/2006 | Hosotani | | |
| 2007/0184561 A1 * | 8/2007 | Guo et al. | | 438/3 |
| 2007/0258281 A1 * | 11/2007 | Ito et al. | | 365/158 |
| 2008/0001207 A1 * | 1/2008 | Guo et al. | | 257/316 |
| 2009/0057794 A1 * | 3/2009 | Guo et al. | | 257/421 |

* cited by examiner

*Primary Examiner*—Laura M Menz
(74) *Attorney, Agent, or Firm*—Saile Ackerman LLC; Stephen B. Ackerman

(57) ABSTRACT

The present invention provides an MRAM that includes a conductive line for generating a magnetic field. The latter is enhanced by the addition of a flux concentrator made from a single plane of soft ferromagnetic material, magnetically stabilized by means of an antiferromagnetic layer. This structure, in addition to being very easy to fabricate, facilitates close control over its magnetic properties, including uniformity and domain structure.

9 Claims, 4 Drawing Sheets

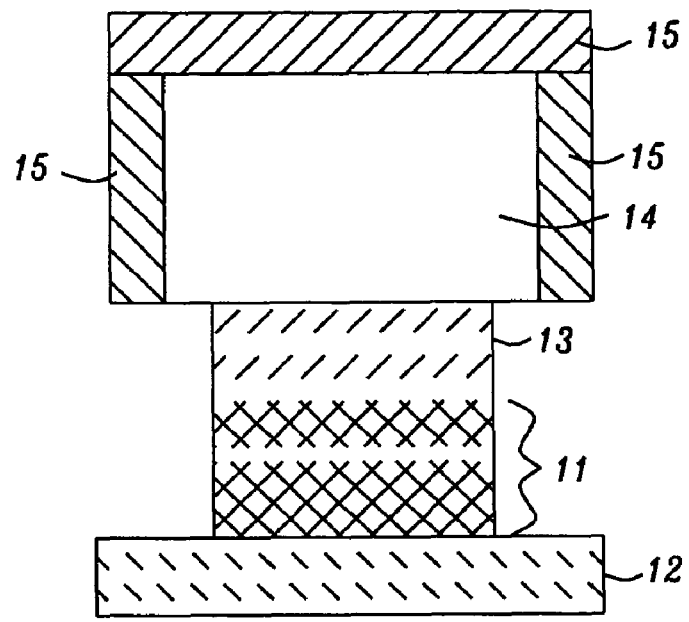
FIG. 1 – Prior Art
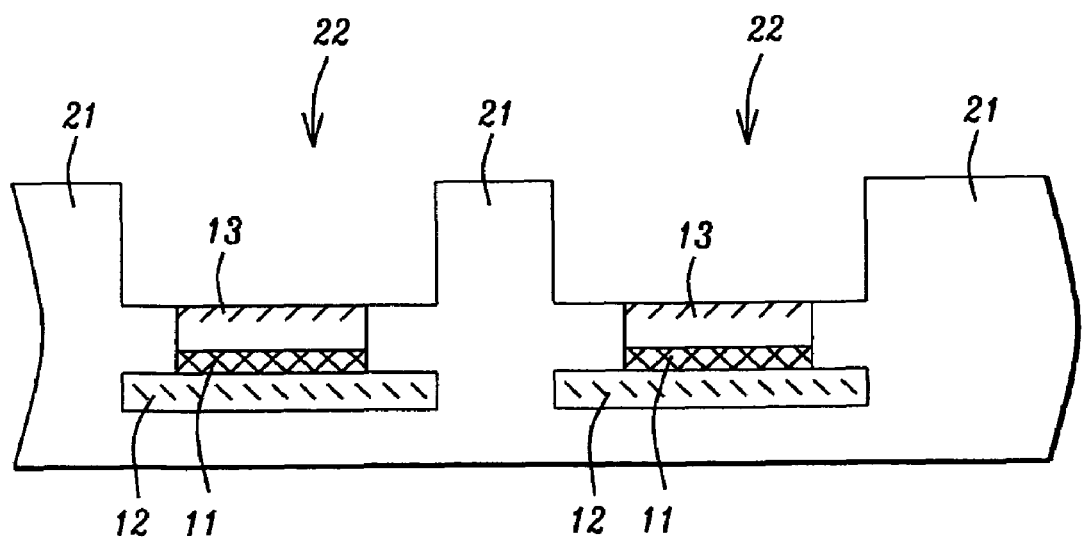
FIG. 2

PLANAR FLUX CONCENTRATOR FOR MRAM DEVICES

This is a divisional application of U.S. patent application Ser. No. 11/476,495, filed on Jun. 28, 2006 now U.S. Pat. No. 7,456,029, which is herein incorporated by reference in its entirety, and assigned to a common assignee.

FIELD OF THE INVENTION

The invention relates to the general field of MRAM devices with particular reference to the write operation.

BACKGROUND OF THE INVENTION

A significant amount of power is consumed during a write operation of an MRAM cell in an MRAM device having an array of cells. The write operation consists of passing currents through conductive lines external, but in close proximity, to the MRAM magnetic element. The magnetic fields generated by these currents are required to be sufficient to switch the magnetic state of the free layer of the magnetic element.

Magnetic random access memory (MRAM) using magnetic tunneling junctions (MTJ) is a strong candidate to provide a dense (areas of 8-25$f^2$ where f is the smallest feature size), fast (1-30 ns read/write speed) and non volatile storage solution for future memory applications. The MTJ utilizes at least 2 magnetic layers, that sandwich a thin dielectric insulating layer like alumina or magnesia, with one magnetic layer being pinned by an antiferromagnetic film. The magnetic vectors in the layers can be oriented to be parallel or antiparallel to each other. The top magnetic layer with switchable magnetic vector is referred to as the storage or free layer.

To protect data from erasure or thermal agitation, an in-plane uniaxial magnetic anisotropy is needed for the magnetic free layer to store data. The intersection of Word and Bit line currents programs the MTJs of MRAM cells. The magnitude of the magnetic field used to switch the magnetic vector is proportional to the magnitude of the currents through these conductors. To reduce power consumption, it is desirable to increase the field to current ratio of said conductors.

One conventional technique for increasing the field to current ratio is to provide a magnetic liner for the conductors. An example of this is illustrated in FIG. 1. Shown there is MTJ stack 11 that rests on bottom electrode 12 and is topped by capping layer/top electrode 13. Conductive bit line 14 is seen to be in contact with cap 13. The direction of line 14 is normal to the plane of the figure. Ferromagnetic cladding layers 15 surround the bit line on three sides and serve to increase the current induced magnetic switching field that is applied to magnetic elements sitting on top of a metal line containing such a cladding layer. Power consumption and chip size may thus be reduced as less current is needed to generate a given switching field; switching word line transistors can thus also be made smaller. This is important because, for small magnetic elements (about 0.1 micron), it is expected that the switching fields will need to increase, causing the switch transistors to consume a significant amount of chip area.

Ferromagnetic cladding layers are typically made by wrapping a ferromagnetic material around the metal line. The magnetization of the ferromagnetic material is along the long axis of the metal line, thus creating poles at both ends. It has been shown that at such poles the fringing field is of the order of 50 to 300 Gauss. The magnetic cells should thus be some distance from the line ends in order not to shift the switching point of the cells. A safe distance can be calculated to be several micrometers—such a distance results in significant limitations to the chip layout since the arrays in memory chips should be packed as densely as possible.

Depending on current direction, ferromagnetic cladding layers may also show a hysteresis effect. The fields for switching of the ferromagnetic cladding layer magnetization direction are normally much higher than the fields for magnetic elements. There can also be domain effects in a ferromagnetic cladding layer which allow a partially local switching of the ferromagnetic cladding layer when a current is passed through the line. This partial switching broadens the switching field distribution for the magnetic elements thereby significantly reducing the write margin. The fringing fields and hysteresis effects associated with a ferromagnetic cladding layer thus limit the use of the ferromagnetic cladding layer in a memory chip having tight element spacing and thousands of elements in a sub-array.

In order to overcome these problems, liners having super-paramagnetic properties have been reported. The cladding layer in this case comprises ferromagnetic particles with a non-exchange coupled microstructure where the size of the micro domains is so small that their energy content is close to or below kT (on the order of up to 5 times kT) so such films have super paramagnetic properties and essentially behave like a paramagnet with high susceptibility. So a cladding layer of these particles acts as a super-paramagnet.

Without an external magnetic field induced by the current, local magnetic moments cancel each other out (super paramagnetic effect); with an external magnetic field the local magnetic moments are aligned by the current induced field to give the desired field enhancement effect. Thus, when a super-paramagnetic material is used, no hysteresis effects and no fringing fields occur.

The super-paramagnetic films discussed above are made either from small ferromagnetic particles in a polymeric matrix, as a particle film, or evaporated multi-layer films made out of repeated layers of Terbium and ferromagnetic particles, or deposition of ferromagnetic nano-particles.

A routine search of the prior art was performed with the following references of interest being found:

U.S. Pat. No. 6,943,038, U.S. Patent Applications 2005/0208681, 2005/0164413 (Meixner et al) disclose a cladding layer formed within a trench over a bit line. The cladding layer is flux-concentrating. No insulator is formed between the bit line and the cladding layer. U.S. Pat. No. 6,885,074, U.S. Patent Applications 2004/0099908, 2005/0158992 (Durlam et al) and U.S. Pat. No. 6,559,511 (Rizzo) describe cladding on the top and sides of bit lines.

U.S. Patent Application 2005/0026308 (Ingvarsson et al) shows a super-paramagnetic lining on the top and sides of a conductor. U.S. Patent Application 2005/0274997 (Gaidis et al) teaches a magnetic flux layer on the top and sides of the write line. U.S. Patent Application 2006/0083053 (Hosotani) shows a soft magnetic flux concentrating layer formed around the bit line.

SUMMARY OF THE INVENTION

It has been an object of at least one embodiment of the present invention to provide an effective flux concentrator for use with an MRAM Bit line Another object of at least one embodiment of the present invention has been to provide a low cost process for the manufacture of said flux concentrator.

Still another object of at least one embodiment of the present invention has been that said flux concentrator be free of hysteresis effects.

These objects have been achieved by constructing the flux concentrator from a single plane of soft ferromagnetic material, magnetically stabilized by means of an antiferromagnetic layer. This structure, in addition to being very easy to fabricate, facilitates close control over its magnetic properties, including uniformity and domain structure. Magnetic liners of the type described in the prior art may be optionally included but this makes for a more expensive structure.

BRIEF DESCRIPTION OF THE DRAWINGS

FIG. 1 illustrates a prior art structure for concentrating the write field

FIGS. 2-4 illustrate steps in the process of the present invention

DESCRIPTION OF THE PREFERRED EMBODIMENTS

Figure 3:
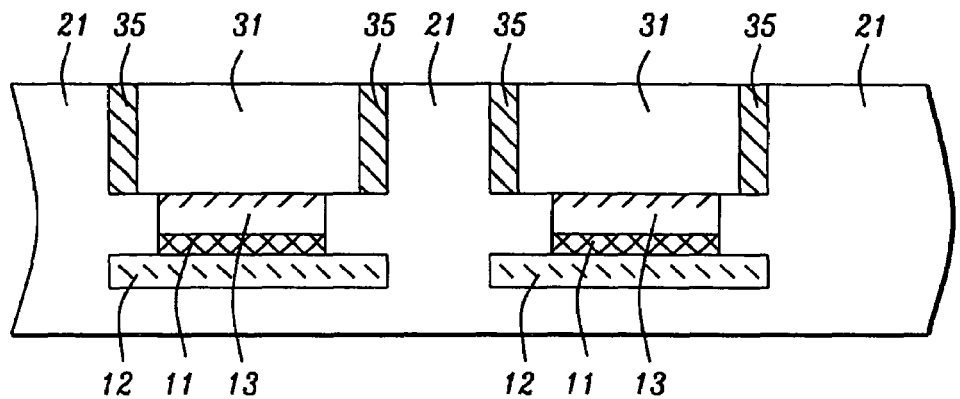

In this invention, a planar soft ferromagnetic layer that serves as a flux concentrator for the conductive bit line, as part of a magnetic random access memory, is disclosed. Its fabrication process is very simple and its magnetic properties, including uniformity, and domain structure are easily controlled. The magnetic liners described in the prior art for use as flux concentrators are difficult to fabricate. Magnetic material/domains may not be sufficiently uniform and stable to serve as good flux concentrators.

We now describe the process of the present invention which will also make clear the structure of the present invention. Referring now to FIG. 2, the process of the present invention begins with the provision of MTJ stack 11, including capping layer 13 and bottom electrode 12, all these elements being encapsulated in dielectric layer 21.

As shown in FIG. 2, trench 22 is then etched (using RIE or other suitable etching process) in dielectric layer 21 its dimensions being such that it fully overlaps capping layer 13. It extends downwards as far as the top surface of capping layer 13.

At this point, as an optional step, a layer may be deposited on the vertical sidewalls of trench 22. This layer may be either a super-paramagnetic material (having a thickness between about 200 and 1,000 Angstroms) or a ferromagnetic material (between about 50 and 1,000 Angstroms thick).

Then, as seen in FIG. 3, trench 22 is just filled with a conductive material, typically Cu, thereby forming bit line 31 that passes over MTJ stack 11 and that has a top surface coplanar with the top surface of dielectric 21. This is accomplished by first over-filling the trench, following which a chemical mechanical polishing (CMP) process is used to remove all conductive material (and liner material if used) above the top surface of dielectric 21, thus electrically isolating individual conductors from each other.

Figure 4:
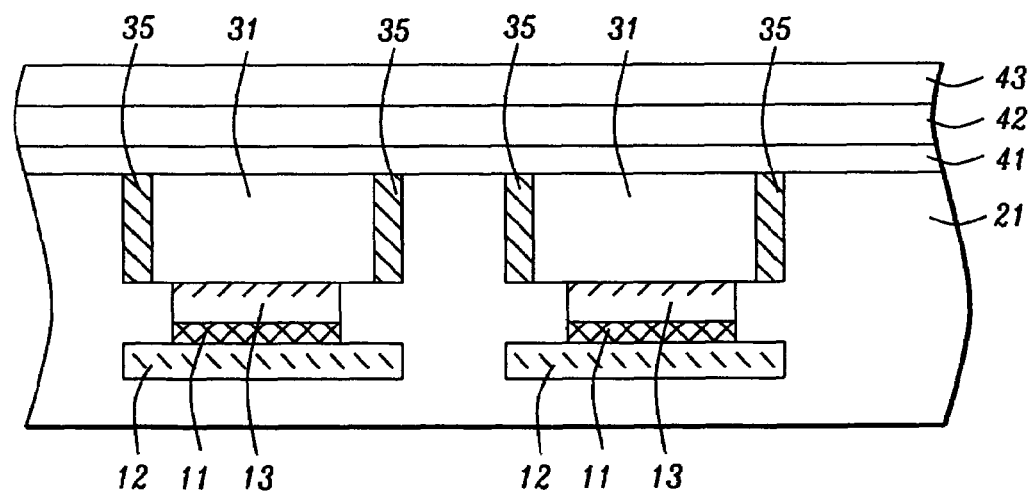

We next refer to FIG. 4 where we illustrate the key features of the invention. Insulating layer 41 is deposited onto the monoplanar surface shared by dielectric layer 21 and bit line 31. Insulating layer 41 is deposited to a thickness between about 100 and 500 Angstroms. Optionally, layer 41 may also be highly permeable which would serve to further enhance the magnetic field.

This is followed by the deposition, in succession, of ferromagnetic layer 42 (to a thickness of between about 50 and 500 Angstroms} and antiferromagnetic layer 43. Examples of layer 43 include IrMn while examples of ferromagnetic layer 42 include NiFe, NiFeCo, and NiFeX, where X is a non-magnetic metal known to be a magnetic moment dilution agent.

Note that it is important that ferromagnetic layer 42 be given a permeability normal to the bit line direction of between about 10 and 300, with around 100 being preferred. This can be achieved by adjusting the thickness of layer 42 and/or through the addition to ferromagnetic layer 42 of one or more dopants such as Ta, Cr, Pt, Ti, B, W etc.

Note that, as an option, a seed layer of NiCr or NiFeCr [ANY OTHERS?] may be deposited on insulating layer 41 immediately prior to the deposition of ferromagnetic layer 42. This seed layer would typically have a thickness of between about 30 and 50 Angstroms.

This concludes the process for forming the flux concentrator except for a required annealing step. This comprises heating at a temperature between about 150 and 250° C. for between about 5 and 200 minutes in the presence of a magnetic field of between about 50 and 2,000 Oe, whose direction is parallel to that of the bit line. This results in the formation of a domain stabilizing field for ferromagnetic layer 42.

Figure 5:
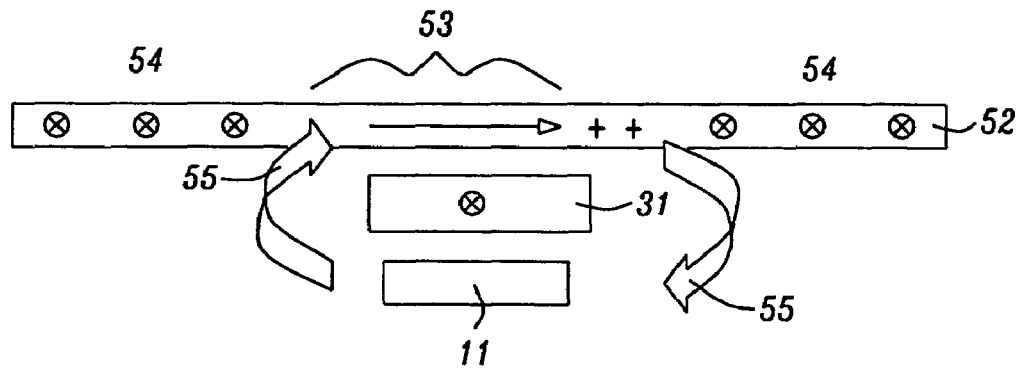
FIG. 5 explains the basic principle of the present invention.

The working principle of the present invention is illustrated in FIG. 5. Before a current is applied along conductive bit lines, the magnetization in the planar flux concentrating layer 52 is uniformly aligned in the direction of the bit line by the pinning field of its AFM component. As a current is applied in the bit line, the magnetization in region 53 of the planar layer (which is located close to the top of the bit line) rotates while the magnetization in other regions 54 stays essentially unchanged, yielding magnetic charges near the two edges of the bit line. These magnetic charges generate an additional magnetic field 55 on the MTJ free layer, enhancing the total write field by a significant amount.

Figure 6:
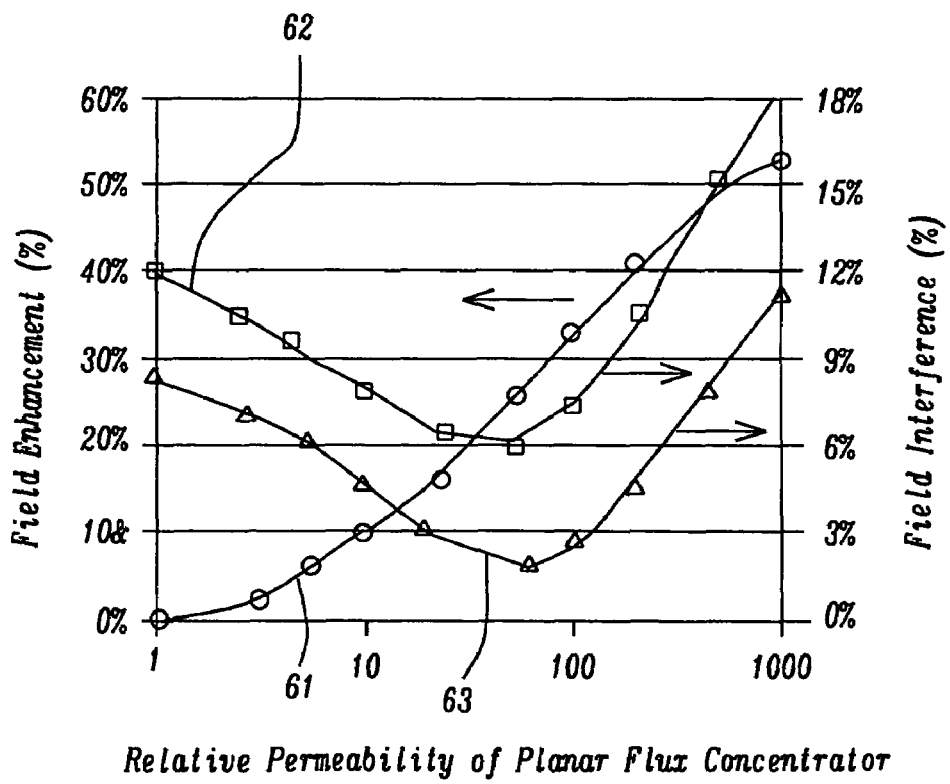
FIGS. 6 and 7 are computed curves showing the effects of layout density on field interference between adjacent devices in an array.

A computed example is given in FIG. 6. The flux concentrating layer is 25 nm thick and separated by an insulator 25 nm thick from the bit line top surface. The bit line is 0.7 micron wide and 0.225 micron thick. The MTJ free element with 0.3×0.6 sq. microns of area is 50 nm below the bit line bottom surface. The field enhancement by the flux concentrating layer as a percentage is represented by curve 61, while the field interferences by its two adjacent bit line currents are represented by curve 62 (bit line pitch of 1.0 micron) and curve 63 (bit line pitch of 1.2 micron).

Figure 7:
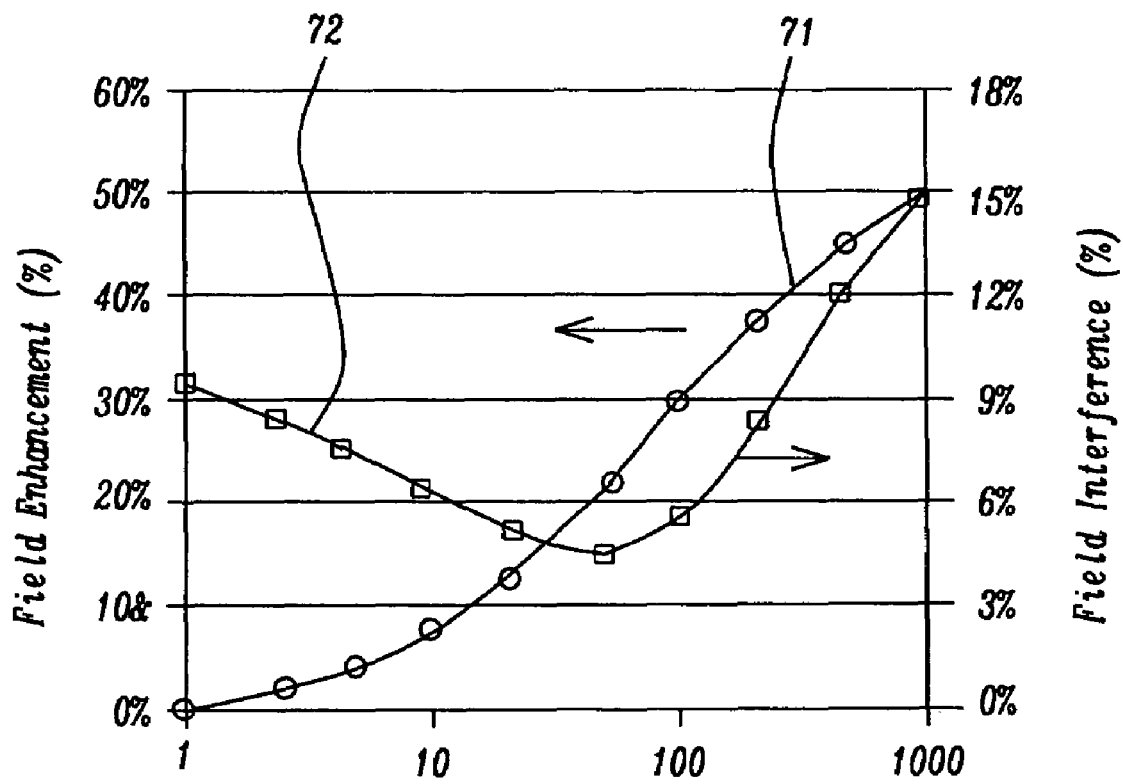

Another calculated example is given in FIG. 7. The flux concentrating layer is 25 nm thick and separated by an insulator 25 nm thick from the bit line top surface. On two side surfaces of the bit line, 50 nm super-paramagnetic material (or ferromagnetic material) is formed as side liners with relative permeability of 10. The bit line width is 0.7 micron wide and 0.45 micron thick. The MTJ free element with 0.3×0.6 micron$^2$ dimension is 50 nm below the bit line bottom surface. The field enhancement by the flux concentrating layer is represented as a percentage by curve 71, while the field interferences by its two adjacent bit line currents are represented by curve 72 (bit line pitch of 1.0 micron).

We note here that the structure of the present invention is easily made, having well controllable, uniform and stable magnetic properties, and having much higher write field and smaller adjacent bit line current interference which is well-suited for magnetic cladding function.

What is claimed is:

1. A low cost flux concentrator, comprising:

an MTJ stack, including a capping layer having a top surface, a bottom electrode, and a dielectric layer, having a top surface, that encapsulates said MTJ stack and extends above said capping layer;

in said dielectric layer, a trench, having vertical sidewalls, that is longer and wider than said capping layer and that extends downwards as far as said capping layer top surface;

said trench being filled with a conductive material that serves as a bit line that passes over said MTJ stack and that has a top surface coplanar with said dielectric top surface;

an insulating layer on said coplanar surfaces;

a ferromagnetic layer on said insulating layer; and on said ferromagnetic layer, an antiferromagnetic layer that serves to keep said ferromagnetic layer magnetized in a direction parallel to said bit line, thereby providing a domain stabilizing field.

2. The flux concentrator described in claim 1 further comprising a layer selected from the group consisting of super-paramagnetic materials and ferromagnetic materials, on said vertical sidewalls.

3. The flux concentrator described in claim 1 further comprising, between said insulating and ferromagnetic layers, a seed layer, selected from the group consisting of NiCr and NiFeCr, having a thickness of between about 30 and 50 Angstroms.

4. The flux concentrator described in claim 1 wherein said ferromagnetic layer has a permeability normal to said bit line direction of between about 10 and 300 by virtue of containing one or more dopants selected from the group consisting of Ta, Cr, Pt, Ti, B, W, and Cu and by having an adjusted thickness.

5. The flux concentrator described in claim 1 wherein said insulating layer has a thickness of between about 100 and 500 Angstroms.

6. The flux concentrator described in claim 1 wherein said ferromagnetic layer is selected from the group consisting of NiFe, NiFeCo, and NiFeX, where X is a non-magnetic metal known to be a magnetic moment dilution agent.

7. The flux concentrator described in claim 1 wherein said ferromagnetic layer has a thickness of between about 50 and 500 Angstroms.

8. The flux concentrator described in claim 1 wherein said insulating layer is also ferromagnetic or super paramagnetic.

9. The flux concentrator described in claim 1 wherein said flux concentrator and said MTJ stack are part of a magnetic random access memory.

* * * * *